United States Patent
Hilali et al.

(10) Patent No.: US 9,834,470 B1
(45) Date of Patent: Dec. 5, 2017

(54) THICK-FILM PASTE FOR FRONT-SIDE METALLIZATION IN SILICON SOLAR CELLS

(71) Applicant: Zhejiang Kaiying New Materials Co., Ltd., Zhejiang (CN)

(72) Inventors: Mohamed M. Hilali, San Ramon, CA (US); Jifeng Wei, Zhejiang (CN)

(73) Assignee: Zhejiang Kaiying New Materials Co., Ltd., Zhejiang (CN)

( * ) Notice: Subject to any disclaimer, the term of this patent is extended or adjusted under 35 U.S.C. 154(b) by 0 days.

(21) Appl. No.: 15/663,296

(22) Filed: Jul. 28, 2017

Related U.S. Application Data

(63) Continuation of application No. PCT/CN2016/095508, filed on Aug. 16, 2016.

(51) Int. Cl.

| | |
|---|---|
| *H01B 1/22* | (2006.01) |
| *C03C 3/12* | (2006.01) |
| *C03C 8/10* | (2006.01) |
| *H01L 31/0264* | (2006.01) |
| *H01L 31/0224* | (2006.01) |
| *C03C 4/04* | (2006.01) |
| *H01B 1/02* | (2006.01) |
| *H01L 51/00* | (2006.01) |

(52) U.S. Cl.
CPC ............... *C03C 8/10* (2013.01); *C03C 4/04* (2013.01); *H01B 1/02* (2013.01); *H01B 1/22* (2013.01); *H01L 31/0264* (2013.01); *H01L 31/022425* (2013.01); *H01L 51/002* (2013.01)

(58) Field of Classification Search
CPC .... H01B 1/00; H01B 1/16; H01B 1/22; C03C 3/12; C03C 4/14; C03C 4/16; C03C 14/006
See application file for complete search history.

(56) References Cited

U.S. PATENT DOCUMENTS

| | | | |
|---|---|---|---|
| 8,093,491 B2 * | 1/2012 | Sridharan | C03C 3/064 136/252 |
| 9,209,323 B2 * | 12/2015 | Hayashi | H01L 31/022425 |
| 2010/0308462 A1 * | 12/2010 | Konno | C03C 8/02 257/741 |
| 2011/0308597 A1 * | 12/2011 | Carroll | B22F 1/0059 136/256 |
| 2011/0315217 A1 | 12/2011 | Gee et al. | |

(Continued)

FOREIGN PATENT DOCUMENTS

| | | |
|---|---|---|
| CN | 101948639 A | 1/2011 |
| CN | 102290120 A | 12/2011 |

(Continued)

OTHER PUBLICATIONS

International Search Report and Written Opinion for International Application No. PCT/CN2016/095508, dated May 5, 2017, 8 pages.

(Continued)

*Primary Examiner* — Mark Kopec

(57) ABSTRACT

Frontside metallization pastes for solar cell electrodes prepared from glass frit containing rare earth metals such as lanthanum and yttrium are disclosed. Electrodes prepared from the metallization pastes exhibit improved adhesion, reliability, and excellent electrical properties.

22 Claims, 3 Drawing Sheets

(56) References Cited

U.S. PATENT DOCUMENTS

| | | | |
|---|---|---|---|
| 2013/0255770 A1* | 10/2013 | Carroll | B22F 1/0059 |
| | | | 136/256 |
| 2014/0299187 A1 | 10/2014 | Chang et al. | |
| 2014/0338747 A1 | 11/2014 | Choi et al. | |
| 2015/0144183 A1 | 5/2015 | Yang et al. | |
| 2015/0243807 A1 | 8/2015 | Raskar et al. | |
| 2015/0280024 A1* | 10/2015 | Song | H01L 31/022425 |
| | | | 136/256 |
| 2015/0333197 A1 | 11/2015 | Takeda et al. | |
| 2015/0364622 A1* | 12/2015 | Jung | H01L 31/022425 |
| | | | 252/514 |

FOREIGN PATENT DOCUMENTS

| | | |
|---|---|---|
| CN | 102592708 | 7/2012 |
| CN | 104036842 A | 9/2014 |
| CN | 104103699 | 10/2014 |
| CN | 104167454 | 11/2014 |
| CN | 104282357 | 1/2015 |
| CN | 104599741 A * | 5/2015 |
| CN | 104681648 | 6/2015 |
| CN | 104867535 A | 8/2015 |
| CN | 105261669 | 1/2016 |
| CN | 106158068 | 11/2016 |
| CN | 106297956 | 1/2017 |
| KR | 20020060926 A | 7/2002 |
| KR | 101377555 B1 * | 3/2014 |

OTHER PUBLICATIONS

Kim et al., "Capillary flow of amorphous metal for high performance electrode," Scientific Reports, 2013, vol. 3, No. 2185, 7 pages.

International Search Report and Written Opinion for International Application No. PCT/CN2016/111036, dated Sep. 1, 2017, 9 pages.

International Search Report and Written Opinion for International Application No. PCT/CN2016/111035, dated Sep. 27, 2017, 8 pages.

* cited by examiner

THICK-FILM PASTE FOR FRONT-SIDE METALLIZATION IN SILICON SOLAR CELLS

This application is a continuation of International Patent Application No. PCT/CN2016/095508, filed on Aug. 16, 2016, which is incorporated by reference in its entirety.

FIELD

Screen-printable thick-film pastes for use in the fabrication of front-side contact of photovoltaic device, and in particular for use in silicon solar cells requiring fine line front-side contacts are disclosed. The thick-film pastes comprise silver particles, or other metal source, and lead-tellurium-bismuth-tungsten glass frit containing lanthanum and/or yttrium dispersed in an organic medium.

BACKGROUND

Solar cells are generally made of semiconductor materials, which convert sunlight into electricity. A conventional silicon solar cell is typically made of a thin wafer of generally p-type base silicon (Si) having a negative electrode on the front side or sun-facing side and a positive electrode on the back side. Alternatively, n-type Si wafers can be used with adjustment in the front-side doping to p-type, for example, using a boron emitter. A p-n junction can be fabricated by diffusing phosphorus (P) from a suitable phosphorus source into the p-type Si wafer. An anti-reflective coating (ARC) is generally applied on the top of the front side of the solar cell to prevent reflective loss of sunlight. An ARC can be a silicon nitride layer deposited by plasma-enhanced chemical vapor deposition. Radiation of an appropriate wavelength impinging on the semiconductor serves as a source of external energy to generate electron-hole pairs in the base of the solar cell. Due to the potential difference at the p-n junction, holes and electrons move across the junction in opposite directions to generate an electric current. The current is collected by a conductive grid/metal contact applied to the surfaces of the silicon semiconductor and directed to external circuitry.

In general, for Si solar cell metallization applications, thick-film pastes are used to form the conductive grids or metal contacts. Thick-film pastes can include a suspension of conductive metal, glass frit, organic vehicles, and modifiers. Silver is the most common conductive filler used for front-side contact paste. Glass frit are used to bind the functional/conductive phase to a silicon wafer after thermal treatment. The glass frit also etches through anti-reflective and passivation layers to provide ohmic contact between the silver grid and the silicon surface of the solar cell. The vehicle is an organic system that acts as a rheological carrier to control flow and printability of the paste. The organic vehicle is composed of resins, solvents, and additives. The attributes of the metallization paste, in particular the front-side silver paste, is important for achieving high efficiency solar cells. Therefore, the quality and performance of the silver metallization paste affects the economics of solar systems. The screen printing technology that is currently used for the majority of solar cells is being further developed for printing fine-line conductive grids to reduce silver consumption and thereby reduce cost, to reduce shading and thereby increase the current density, and to improve photovoltaic module performance.

To maintain high efficiencies over time it is important that the pull strength and the adhesion of the solar cell metallization be robust. Achieving low specific contact resistance on lightly-doped high sheet resistance Si emitters (about 100 Ω/sq or greater) for thick-film screen-printed metallization depends on a number of interrelated factors that are not fully understood. To also achieve high pull strength is challenging because as the weight percent of the glass frit, which acts as the high temperature binder, is increased to improve the adhesion strength, the contact resistance of the conductor also increases resulting in the concomitant decrease in the fill factor (FF) and the conversion efficiency for the solar cell. Also, increasing the amount of one of the main glass network formers such as the lead oxide will decrease the quality of the p-n junction, which reduces the conversion efficiency. Increasing the quantity of printed metallization paste to increase the final pull strength of the fired conductor is also not desirable because of increased material costs.

Silver metallization pastes containing glass frit formed using various metal oxides such as disclosed in U.S. Application Publication No. 2015/0364622 have not demonstrated improved electrical performance compared to conductors prepared from pastes without the metal oxide frit.

To provide an economical process for manufacturing high efficiency photovoltaic cells, there is a need for a thick-film metallization paste that can be screen-printed to provide conductive grids with small feature dimensions and a high aspect ratio with printability resolution, and that exhibit low resistivity, high adhesion strength to the semiconductor substrate as well as between the Ag bulk and the glass at the contact interface, and excellent solderability. The fired screen-printed metallization should also exhibit a low specific contact resistance, excellent junction ideality, and high fill factor (FF).

SUMMARY

According to the present invention, compositions comprise silver particles; fumed silica; and glass frit, wherein the glass frit comprises a rare earth oxide comprising lanthanum oxide $La_2O_3$, yttrium oxide $Y_2O_3$, or a combination thereof.

According to the present invention, solar cells comprise an electrode prepared from a composition according to the present invention.

According to the present invention, glass frit prepared from a composition comprise from 20 wt % to 60 wt % lead oxide PbO; from 20 wt % to 60 wt % tellurium oxide TeO; from 1 wt % to 30 wt % bismuth oxide $Bi_2O_3$; from 0.1 wt % to 5 wt % tungsten oxide $WO_3$; from 0.1 wt % to 5 wt % copper oxide $Cu_2O$; and from 0.01 wt % to 1 wt % of a rare earth metal oxide comprising lanthanum oxide $La_2O_3$, yttrium oxide $Y_2O_3$, or a combination thereof, wherein wt % is based on the total weight of the composition.

According to the present invention, glass frit comprise from 21 wt % to 64 wt % lead Pb; from 19 wt % to 55 wt % tellurium Te; from 1.05 wt % to 31 wt % bismuth Bi; from 0.09 wt % to 4.5 wt % tungsten W; from 0.12 wt % to 5.1 wt % copper Cu; and from 0.01 wt % to 1 wt % of a rare earth metal comprising lanthanum La, yttrium Y, or a combination thereof, wherein wt % is based on the weight of the glass frit.

According to the present invention, solar cells comprise an electrode, wherein the electrode comprises the glass frit according to the present invention.

According to the present invention, solar cells comprise an electrode, wherein the electrode comprises from 0.6 wt % to 1.9 wt % lead Pb; from 0.6 wt % to 1.6 wt % tellurium Te; from 0.03 wt % to 0.9 wt % bismuth Bi; from 0.003 wt % to 0.13 wt % tungsten W; from 0.004 wt % to 0.15 wt % copper Cu; and from 0.0003 wt % to 0.029 wt % of a rare earth metal comprising lanthanum La, yttrium Y, or a combination thereof, wherein wt % is based on the weight of the electrode.

According to the present invention, a glass frit can be prepared from a metal oxide composition comprising from 20 wt % to 60 wt % lead oxide PbO; from 20 wt % to 60 wt % tellurium oxide TeO; from 1 wt % to 30 wt % bismuth oxide $Bi_2O_3$; from 0.1 wt % to 5 wt % tungsten oxide $WO_3$; from 0.1 wt % to 5 wt % copper oxide $Cu_2O$; and from 0.01 wt % to 1 wt % of a rare earth oxide comprising lanthanum oxide $La_2O_3$, yttrium oxide $Y_2O_3$, or a combination thereof, wherein wt % is based on the total weight of the glass frit.

According to the present invention, a solar cell comprises an electrode, wherein the electrode comprises from 0.6 wt % to 1.8 wt % of lead oxide PbO; from 0.6 wt % to 1.8 wt % of tellurium oxide TeO; from 0.03 wt % to 0.9 wt % of bismuth oxide $Bi_2O_3$; from 0.003 wt % to 0.15 wt % of tungsten oxide $WO_3$; from 0.003 wt % to 0.15 wt % of copper oxide $Cu_2O$; and from 0.0003 wt % to 0.03 wt % of a rare earth oxide comprising lanthanum oxide $La_2O_3$, yttrium oxide $Y_2O_3$, or a combination thereof, wherein wt % is based on the total weight of the glass frit.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

Figure 1:
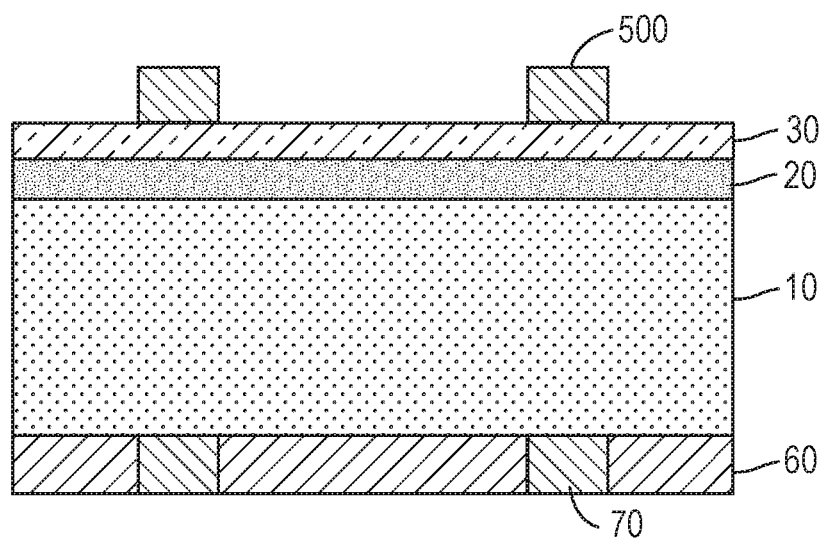
FIG. 1 shows the structure of a conventional silicon solar cell after the metallization paste is applied and before thermal processing.

Solar cell electrodes must exhibit excellent electrical conductivity and pull strength. The composition of the glass frit used to form the electrodes can impact both the electrical conductivity and the pull strength. In selecting the metal oxides used to form the glass frit it is difficult to select a combination of metal oxides that improve the pull strength without compromising the electrical conductivity.

Silver metallization pastes that can be used to provide high efficiency solar cells and that have improved adhesion to Si substrates include glass frit containing the metal oxides, lanthanum oxide $La_2O_3$, yttrium oxide $Y_2O_3$, or combinations thereof. Other rare earth oxides such as cerium oxide and scandium oxide were investigated but metallization pastes were found to decrease the pull strength of solar cell electrodes containing glass frit containing these rare earth oxides. It is believed that the enhanced performance of solar cell electrodes formed using glass frit containing lanthanum oxide $La_2O_3$ and/or yttrium oxide $Y_2O_3$ can be attributed to the high thermal stability of lanthanum oxide $La_2O_3$ and yttrium oxide $Y_2O_3$. It is generally believed that the use of lanthanum oxide $La_2O_3$ and/or yttrium oxide $Y_2O_3$ in glass frit leads to increased series resistance and FF and therefore the improved electrical properties and peel strength exhibited by the solar cell electrodes containing lanthanum oxide $La_2O_3$ and/or yttrium oxide $Y_2O_3$ are unexpected.

Glass frit can be formed from a combination of lead oxide PbO, tellurium oxide $TeO_2$, bismuth oxide $Bi_2O_3$, tungsten oxide $WO_3$, copper oxide $Cu_2O$, and a rare earth oxide such as lanthanum oxide $La_2O_3$, yttrium oxide $Y_2O_3$ or a combination thereof. As used herein, lead oxide PbO refers to lead(II) oxide, tellurium oxide $TeO_2$ refers to tellurium(IV) oxide, bismuth oxide $Bi_2O_3$ refers to bismuth(III) oxide, tungsten oxide $WO_3$ refers to tungsten(VI) oxide, copper oxide $Cu_2O$ refers to copper(I) oxide, lanthanum oxide $La_2O_3$ refers to lanthanum(III) oxide, and yttrium oxide $Y_2O_3$ refers to yttrium(III) oxide.

Glass frit can be formed from a combination of metal oxides containing, for example, from 0.01 wt % to 1 wt %, from 0.05 wt % to 1 wt %, from 0.1 wt % to 1 wt %, from 0.1 wt % to 0.8 wt %, from 0.2 wt % to 0.8 wt %, from 0.3 wt % to 0.8 wt %, from 0.4 wt % to 0.8 wt %, or from 0.5 wt % to 0.8% of a rare earth oxide, where wt % is based on the total weight of the metal oxides used to prepare the glass frit. The rare earth oxide can be lanthanum oxide $La_2O_3$, yttrium oxide $Y_2O_3$ or a combination of lanthanum oxide $La_2O_3$ and yttrium oxide $Y_2O_3$.

Glass frit can be prepared from a combination of metal oxides containing, for example, from 20 wt % to 60 wt % lead oxide PbO, from 25 wt % to 55 wt %, from 30 wt % to 50 wt %, from 35 wt % to 45 wt %, from 20 wt % to 35 wt %, or from 25 wt % to 30 wt % lead oxide PbO, where wt % is based on the total weight of the metal oxides use to prepare the glass frit.

Glass frit can be prepared from a combination of metal oxides containing, for example, from 20 wt % to 60 wt % tellurium oxide $TeO_2$, from 25 wt % to 55 wt %, from 30 wt % to 50 wt %, from 35 wt % to 45 wt %, from 40 wt % to 55 wt %, or from 45 wt % to 53 wt % lead oxide $TeO_2$, where wt % is based on the total weight of the metal oxides use to prepare the glass frit.

Glass frit can be prepared from a combination of metal oxides containing, for example, from 1 wt % to 30 wt % bismuth oxide $Bi_2O_3$, from 5 wt % to 25 wt %, from 10 wt % to 25 wt %, from 15 wt % to 25 wt %, or from 15 wt % to 22 wt %, of bismuth oxide $Bi_2O_3$, where wt % is based on the total weight of the metal oxides use to prepare the glass frit.

Glass frit can be prepared from a combination of metal oxides containing, for example, from 0.1 wt % to 5 wt % tungsten oxide $WO_3$, from 0.5 wt % to 4.5 wt %, from 1 wt % to 4 wt %, from 1.5 wt % to 3.5 wt %, from 2 wt % to 3.5 wt %, or from 2.5 wt % to 3.5 wt % tungsten oxide $WO_3$, where wt % is based on the total weight of the metal oxides use to prepare the glass frit.

Glass frit can be prepared from a combination of metal oxides containing, for example, from 0.1 wt % to 5 wt % copper oxide $Cu_2O$, from 0.5 wt % to 4 wt %, from 1 wt % to 3 wt %, or from 1 wt % to 2 wt % copper oxide $Cu_2O$, where wt % is based on the total weight of the metal oxides use to prepare the glass frit.

Glass frit can be prepared from a combination of metal oxides containing, for example, from 20 wt % to 60 wt % lead oxide PbO, from 20 wt % to 60 wt % tellurium oxide TeO$_2$, from 1 wt % to 30 wt % bismuth oxide Bi$_2$O$_3$, from 0.1 wt % to 5 wt % tungsten oxide WO$_3$, from 0.1 wt % to 5 wt % copper oxide Cu$_2$O, and from 0.01 wt % to 1 wt % of a rare earth oxide such as lanthanum oxide La$_2$O$_3$, yttrium oxide Y$_2$O$_3$ or a combination thereof, where wt % is based on the total weight of the metal oxides.

Glass frit can be prepared from a combination of metal oxides containing, for example, from 20 wt % to 40 wt % lead oxide PbO, from 40 wt % to 60 wt % tellurium oxide TeO$_2$, from 10 wt % to 25 wt % bismuth oxide Bi$_2$O$_3$, from 2 wt % to 4 wt % tungsten oxide WO$_3$, from 0.5 wt % to 2.5 wt % copper oxide Cu$_2$O, and from 0.01 wt % to 1 wt % of a rare earth oxide such as lanthanum oxide La$_2$O$_3$, yttrium oxide Y$_2$O$_3$ or a combination thereof, where wt % is based on the total weight of the metal oxides.

Glass frit can be prepared from a combination of metal oxides containing, for example, from 25 wt % to 35 wt % lead oxide PbO, from 45 wt % to 55 wt % tellurium oxide TeO$_2$, from 15 wt % to 20 wt % bismuth oxide Bi$_2$O$_3$, from 2.5 wt % to 3.5 wt % tungsten oxide WO$_3$, from 1 wt % to 2 wt % copper oxide Cu$_2$O, and from 0.01 wt % to 1 wt % of a rare earth oxide such as lanthanum oxide La$_2$O$_3$, yttrium oxide Y$_2$O$_3$ or a combination thereof, where wt % is based on the total weight of the metal oxides.

Glass frit can contain from 16 wt % to 36 wt % lead Pb, from 18 wt % to 34 wt %, from 20 wt % to 32 wt %, from 22 wt % to 30 wt %, or from 24 wt % to 28 wt % lead Pb, where wt % is based on the total weight of the glass frit.

Glass frit can contain from 34 wt % to 53 wt % tellurium Te, from 36 wt % to 51 wt %, from 38 wt % to 49 wt %, from 40 wt % to 47 wt %, or from 42 wt % to 45 wt % tellurium Te, where wt % is based on the total weight of the glass frit.

Glass frit can contain from 10 wt % to 25 wt % bismuth Bi, from 12 wt % to 23 wt %, from 14 wt % to 21 wt %, or from 16 wt % to 19 wt % bismuth Bi, where wt % is based on the total weight of the glass frit.

Glass frit can contain from 0.09 wt % to 4.5 wt % tungsten W, from 0.5 wt % to 4 wt %, from 1 wt % to 3.5 wt %, from 2 wt % to 3.5 wt %, or from 2.5 wt % to 3.5 wt % tungsten W, where wt % is based on the total weight of the glass frit.

Glass frit can contain from 0.1 wt % to 2 wt % copper Cu, from 0.2 wt % to 1.8 wt %, from 0.4 wt % to 1.6 wt %, from 0.6 wt % to 1.4 wt %, or from 0.8 wt % to 1.2 wt % copper Cu, where wt % is based on the total weight of the glass frit.

Glass frit can contain from 0.01 wt % to 1.4 wt %, such as from 0.1 wt % to 0.1 wt %, or from 0.1 wt % to 0.8 wt % of lanthanum La, yttrium Y, or a combination of lanthanum La and yttrium Y, where wt % is based on the total weight of the glass frit.

Glass frit can comprise from 16 wt % to 36 wt % lead Pb, from 34 wt % to 53 wt % tellurium Te, from 10 wt % to 25 wt % bismuth Bi, from 0.09 wt % to 4.5 wt % tungsten W, from 0.1 wt % to 2 wt % copper Cu, and from 0.01 wt % to 1.4 wt % of a rare earth such as lanthanum La, yttrium Y or a combination thereof, where wt % is based on the total weight of the glass frit.

Glass frit can comprise from 20 wt % to 32 wt % lead Pb, from 38 wt % to 49 wt % tellurium Te, from 14 wt % to 21 wt % bismuth Bi, from 2 wt % to 4 wt % tungsten W, from 0.4 wt % to 1.6 wt % of copper Cu, and from 0.01 wt % to 0.8 wt % of a rare earth such as lanthanum La, yttrium Y or a combination thereof, where wt % is based on the total weight of the glass frit.

Glass frit can comprise from 24 wt % to 28 wt % lead Pb, from 42 wt % to 45 wt % tellurium Te, from 16 wt % to 19 wt % bismuth Bi, from 2.5 wt % to 3.5 wt % tungsten W, from 0.8 wt % to 1.2 wt % of copper Cu, and from 0.1 wt % to 1.2 wt % of a rare earth such as lanthanum La, yttrium Y, or a combination thereof, where wt % is based on the total weight of the glass frit.

When applied to a solar cell and fired, a glass frit can etch through the passivation or anti-reflection coating (ARC) on the front surface of the silicon solar cell and can serve to dissolve silver particles contained in the metallization paste such that the dissolved silver precipitates into the surface of the silicon wafer to form silver crystal grains at the silicon surface to provide low resistance ohmic contacts.

Rare earth-containing glass frit provided by the present disclosure can be used in solar cell metallization pastes to provide improved electrical conductivity and adhesion to Si substrates, and can exhibit long-time reliability.

Metallization pastes can include Ag particles, fumed silica, glass frit provided by the present disclosure and an organic vehicle. An organic vehicle can contain an organic resin, an organic solvent, and one or more additives.

A frontside metallization paste can contain from 55 wt % to 95 wt % Ag particles, less than 5 wt % glass frit, and less than 10 wt % of an organic vehicle, where wt % is based on the total weight of the metallization paste.

A frontside metallization paste can contain from 80 wt % to 95 wt % Ag particles, from 2 wt % to 4 wt % glass frit, and from 6 wt % to 10 wt % of an organic vehicle, where wt % is based on the total weight of the metallization paste.

A frontside metallization paste can contain from 85 wt % to 95 wt % Ag particles, from 2.5 wt % to 3.5 wt % glass frit, and from 7 wt % to 9 wt % of an organic vehicle, where wt % is based on the total weight of the metallization paste.

Metallization paste compositions provided by the present disclosure include silver particles as the primary electrically conductive material. The silver particles can have an average particle diameter D50 from 1 μm to 200 μm, from 1 μm to 150 μm, from 1 μm to 100 μm, from 1 μm to 50 μm, from 1 μm to 30 μm, or from 1 μm to 20 μm. The silver particles can comprise a combination of silver particles with the different silver particles characterized by a different mean particle diameter. The silver particles can be characterized by a distribution of particle diameters.

The silver particles can have an average particle diameter (D50) from 0.1 μm to about 10 μm, or from 0.5 μm to 5 μm. The average particle diameter may be measured using, for example, using a Horiba LA-960 particle size analyzer after dispersing the conductive silver particles in isopropyl alcohol (IPA) at 25° C. for 3 minutes by ultrasonication. Within this range of average particle diameter, the composition can provide low contact resistance and low line resistance.

The silver particles may have a spherical, flake or amorphous shape, or a combination of any of the foregoing.

A metallization paste can comprise, for example, from 60 wt % to 95 wt %, from 70 wt % to 95 wt %, from 80 wt % to 95 wt %, or from 85 wt % to 95 wt % of silver particles, where wt % is based on the total weight of the metallization paste.

Fumed silica can be used to control the degree of etching of the anti-reflection layer by the glass frit, and can minimize diffusion of the glass frit into the silicon wafer during the baking process, which would otherwise introduce undesirable impurities into the silicon substrate.

The fumed silica can be a synthetic silica prepared by a drying method, and may have a high purity of about 99.9% or more. The fumed silica may be prepared, for example, by thermal decomposition of a chlorosilane compound in a gas phase.

The fumed silica can have a specific surface area from 20 m$^2$/g to 500 m$^2$/g, such as from 50 m$^2$/g to t 200 m$^2$/g.

Within this range, it is possible to adjust the degree of etching and secure the flow for minimizing diffusion of impurities into the wafer during the baking process, thereby reducing series resistance due to the diffusion of impurities while improving fill factor and conversion efficiency. In certain embodiments, the fumed silica may have a specific surface area of about 20 m$^2$/g, 30 m$^2$/g, 40 m$^2$/g, 50 m$^2$/g, 60 m$^2$/g, 70 m$^2$/g, 80 m$^2$/g, 90 m$^2$/g, 100 m$^2$/g, 110 m$^2$/g, 120 m$^2$/g, 130 m$^2$/g, 140 m$^2$/g, 150 m$^2$/g, 160 m$^2$/g, 170 m$^2$/g, 180 m$^2$/g, 190 m$^2$/g, or 200 m$^2$/g.

The fumed silica may be present in an amount of about 0.2 wt % or less, such as from 0.01 wt % to about 0.15 wt %, where wt % is based on the total weight of the composition. When the amount of fumed silica exceeds about 0.1 wt %, the viscosity of the composition can be too high for screen printing. The fumed silica may be present, for example, in an amount of 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, where wt % is based on the total weight of the metallization paste. A metallization paste can comprise from 0.01 wt % to 0.15 wt %, from 0.03 wt % to 0.14 wt %, from 0.05 wt % to 0.13 wt %, from 0.07 wt % to 0.12 wt %, or from 0.09 wt % to 0.11 wt % fumed silica, where wt % is based on the total weight of the metallization paste.

Glass frit serves to enhance adhesion between the conductive silver particles and the silicon substrate and to form silver crystal grains in an emitter region by etching a passivation layer or ARC overlying the silicon substrate and melting the silver particles so as to reduce contact resistance.

Glass frit provided by the present disclosure comprises a rare earth metal such as lanthanum, yttrium, or a combination thereof. Other suitable rare earth metals include scandium (Sc), cerium (Ce), praseodymium (Pr), neodymium Nd), promethium (Pm), samarium (Sm), europium (Eu), gadolinium (Gd), terbium (Tb), dysprosium (Dy), holmium (Ho), erbium Er), thulium (Tm), and lutetium (Lu).

In addition to a rare earth metal, a glass frit can comprise lead (Pb), bismuth (Bi), germanium (Ge), gallium (Ga), boron (B), iron (Fe), silicon (Si), zinc (Zn), tantalum (Ta), antimony (Sb), lanthanum (La), selenium (Se), phosphorus (P), chromium (Cr), lithium (Li), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), aluminum (Al), or a combination of any of the foregoing. For example, a glass frit can comprise lead Pb, tellurium Te, bismuth Bi, tungsten W, copper Cu, and a rare earth selected from lanthanum La, yttrium Y, or a combination thereof.

Glass frit can comprise lanthanum, lead, tellurium, bismuth, tungsten, and copper. For example, glass frit can comprise from 0.01 wt % to 1 wt % lanthanum, from 16 wt % to 36 wt % lead, from 34 wt % to 53 wt % tellurium, from 10 wt % to 25 wt % bismuth, from 0.09 wt % to 4.5 wt % tungsten, and from 0.1 wt % to 2 wt % copper, where wt % is based on the total weight of the glass frit. For example, glass frit can comprise from 0.01 wt % to 1 wt % lanthanum, from 24 wt % to 38 wt % lead, from 42 wt % to 45 wt % tellurium, from 16 wt % to 19 wt % bismuth, from 2 wt % to 4 wt % tungsten, and from 1 wt % to 3 wt % copper, where wt % is based on the total weight of the glass frit.

Glass frit can comprise yttrium, lead, tellurium, bismuth, tungsten, and copper. For example, glass frit can comprise from 0.01 wt % to 1 wt % yttrium, from 16 wt % to 36 wt % lead, from 34 wt % to 53 wt % tellurium, from 10 wt % to 25 wt % bismuth, from 0.09 wt % to 4.5 wt % tungsten, and from 0.1 wt % to 2 wt % copper, where wt % is based on the total weight of the glass frit. For example, glass frit can comprise from 0.01 wt % to 1 wt % yttrium, from 24 wt % to 38 wt % lead, from 42 wt % to 45 wt % tellurium, from 16 wt % to 19 wt % bismuth, from 2 wt % to 4 wt % tungsten, and from 1 wt % to 3 wt % copper, where wt % is based on the total weight of the glass frit.

Glass frit comprises lanthanum, yttrium, lead, tellurium, bismuth, tungsten, and copper. For example, a glass frit can comprise from 0.01 wt % to 1 wt % of a combination of lanthanum and yttrium, from 16 wt % to 36 wt % lead, from 34 wt % to 53 wt % tellurium, from 10 wt % to 25 wt % bismuth, from 0.09 wt % to 4.5 wt % tungsten, and from 0.1 wt % to 2 wt % copper, where wt % is based on the total weight of the glass frit. For example, glass frit can comprise from 0.01 wt % to 1 wt % of a combination of lanthanum and yttrium, from 24 wt % to 38 wt % lead, from 42 wt % to 45 wt % tellurium, from 16 wt % to 19 wt % bismuth, from 2 wt % to 4 wt % tungsten, and from 1 wt % to 3 wt % copper, where wt % is based on the total weight of the glass frit.

Glass frit may be formed from the corresponding oxides.

Glass frit can be formed from a composition comprising lanthanum oxide (La$_2$O$_3$), lead oxide (PbO), tellurium oxide (TeO), bismuth oxide (Bi$_2$O$_3$), tungsten oxide (WO$_3$), and copper oxide (Cu$_2$O). For example, glass frit can be prepared from a composition comprising from 0.01 wt % to 1 wt % lanthanum oxide, from 20 wt % to 60 wt % lead oxide, from 20 wt % to 60 wt % tellurium oxide, from 1 wt % to 30 wt % bismuth oxide, from 0.1 wt % to 5 wt % tungsten oxide, and from 0.1 wt % to 5 wt % copper oxide, where wt % is based on the total weight of the glass frit. For example, glass frit can be prepared from a composition comprising from 0.01 wt % to 1 wt % lanthanum oxide, from 21 wt % to 35 wt % lead oxide, from 40 wt % to 55 wt % tellurium oxide, from 15 wt % to 25 wt % bismuth oxide, from 2 wt % to 4 wt % tungsten oxide, and from 1 wt % to 2 wt % copper oxide, where wt % is based on the total weight of the glass frit.

In certain embodiments, glass frit can be formed from a composition comprising yttrium oxide (Y$_2$O$_3$), lead oxide (PbO), tellurium oxide (TeO), bismuth oxide (Bi$_2$O$_3$), tungsten oxide (WO$_3$), and copper oxide (Cu$_2$O). For example, glass frit can be prepared from a composition comprising from 0.01 wt % to 1 wt % yttrium oxide, from 20 wt % to 60 wt % lead oxide, from 20 wt % to 60 wt % tellurium oxide, from 1 wt % to 30 wt % bismuth oxide, from 0.1 wt % to 5 wt % tungsten oxide, and from 0.1 wt % to 5 wt % copper oxide. For example, glass frit can be prepared from a composition comprising from 0.01 wt % to 1 wt % yttrium oxide, from 21 wt % to 35 wt % lead oxide, from 40 wt % to 55 wt % tellurium oxide, from 15 wt % to 25 wt % bismuth oxide, from 2 wt % to 4 wt % tungsten oxide, and from 1 wt % to 2 wt % copper oxide, where wt % is based on the total weight of the glass frit.

In certain embodiments, glass frit can be prepared from a composition comprising lanthanum oxide (La$_2$O$_3$), yttrium oxide (Y$_2$O$_3$), lead oxide (PbO), tellurium oxide (TeO), bismuth oxide (Bi$_2$O$_3$), tungsten oxide (WO$_3$), and copper oxide (Cu$_2$O). For example, glass frit can comprise from 0.01 wt % to 1 wt % of a combination of lanthanum oxide and yttrium oxide, from 20 wt % to 60 wt % lead oxide, from 20 wt % to 60 wt % tellurium oxide, from 1 wt % to 30 wt % bismuth oxide, from 0.1 wt % to 5 wt % tungsten oxide, and from 0.1 wt % to 5 wt % copper oxide. For example, glass frit can be prepared from a composition comprising from 0.01 wt % to 1 wt % of a combination of lanthanum oxide and yttrium oxide, from 21 wt % to 35 wt % lead oxide, from 40 wt % to 55 wt % tellurium oxide, from 15 wt % to 25 wt % bismuth oxide, from 2 wt % to 4 wt % tungsten oxide, and from 1 wt % to 2 wt % copper oxide, where wt % is based on the total weight of the glass frit.

Thus, in certain embodiments, glass frit can be formed from a composition comprising, for example, from 27.5 wt % to 28.5 wt % lead oxide PbO, from 47.7 wt % to 49.5 wt % tellurium oxide $TeO_2$, from 18 wt % to 19 wt % bismuth oxide $Bi_2O_3$, from 2.5 wt % to 3.5 wt % tungsten oxide, from 1 wt % to 2 wt % copper oxide CuO, and from 0.05 wt % to 1 wt % lanthanum oxide $La_2O_3$ and/or yttrium oxide $Y_2O_3$, where wt % is based on the total weight of the metal oxides. Glass frit can be formed from a composition comprising, for example, from 27.8 wt % to 28.2 wt % lead oxide PbO, from 48 wt % to 49.2 wt % tellurium oxide $TeO_2$, from 18.3 wt % to 18.7 wt % bismuth oxide $Bi_2O_3$, from 2.8 wt % to 3.2 wt % tungsten oxide, from 1.3 wt % to 1.7 wt % copper oxide CuO, and from 0.05 wt % to 1 wt % lanthanum oxide $La_2O_3$ and/or yttrium oxide $Y_2O_3$, where wt % is based on the total weight of the metal oxides.

Glass frit can comprise, for example, from 23 wt % to 29 wt % lead Pb, from 40 wt % to 46 wt % tellurium Te, from 14.5 wt % to 20.5 wt % bismuth Bi, from 2.6 wt % to 3.2 wt % tungsten W, from 0.7 wt % to 1.3 wt % copper Cu, and from 0.1 wt % to 1 wt % lanthanum oxide $La_2O_3$ and/or yttrium oxide $Y_2O_3$, where wt % is based on the total weight of the metals in the glass frit.

Glass frit can comprise, for example, from 24 wt % to 28 wt % lead Pb, from 41 wt % to 45 wt % tellurium Te, from 15.5 wt % to 19.5 wt % bismuth Bi, from 2.7 wt % to 3.1 wt % tungsten W, from 0.8 wt % to 1.2 wt % copper Cu, and from 0.1 wt % to 1 wt % lanthanum oxide $La_2O_3$ and/or yttrium oxide $Y_2O_3$, where wt % is based on the total weight of the metals in the glass frit.

Glass frit can comprise, for example, from 25 wt % to 27 wt % lead Pb, from 42 wt % to 45 wt % tellurium Te, from 16.5 wt % to 18.5 wt % bismuth Bi, from 2.8 wt % to 3.0 wt % tungsten W, from 0.9 wt % to 1.1 wt % copper Cu, and from 0.1 wt % to 1 wt % lanthanum oxide $La_2O_3$ and/or yttrium oxide $Y_2O_3$, where wt % is based on the total weight of the metals in the glass frit.

Glass frit can contain from about 90 wt % to about 92 wt % metal, from 88 wt % to 94 wt %, from 86 wt % to 96 wt %, or from 84 wt % to 98 wt % metal, where wt % is based on the total wt % metal in the glass frit.

Glass frit can comprise from 27 wt % to 30 wt % lead Pb, from 26 wt % to 31 wt %, from 25 wt % to 32 wt %, or from 24 wt % to 33 wt % lead Pb, where wt % is based on the total wt % metal in the glass frit.

Glass frit can comprise from 47 wt % to 49 wt % tellurium Te, from 45 wt % to 51 wt %, from 43 wt % to 53 wt %, or from 41 wt % to 55 wt % tellurium Te, where wt % is based on the total wt % metal in the glass frit.

Glass frit can comprise from 18 wt % to 20 wt % bismuth Bi, from 17 wt % to 21 wt %, from 16 wt % to 22 wt %, or from 15 wt % to 23 wt % bismuth Bi, where wt % is based on the total wt % metal in the glass frit.

Glass frit can comprise from 3 wt % to 4 wt % tungsten W, from 2.8 wt % to 4.2 wt %, from 2.6 wt % to 4.4 wt %, or from 2.6 wt % to 4.6 wt % tungsten W, where wt % is based on the total wt % metal in the glass frit.

Glass frit can comprise from 0.9 wt % to 1.1 wt % copper Cu, from 0.8 wt % to 1.2 wt %, from 0.7 wt % to 1.3 wt %, or from 0.6 wt % to 1.4 wt % copper Cu, where wt % is based on the total wt % metal in the glass frit.

Glass frit can comprise from 0.1 wt % to 1.1 wt % lanthanum La and/or yttrium Y, from 0.1 wt % to 1 wt %, from 0.1 to 0.8 wt %, or from 0.1 wt % to 0.6 wt % lanthanum La and/or yttrium Y, where wt % is based on the total wt % metal in the glass frit.

Glass frit can comprise from 27 wt % to 30 wt % lead Pb, from 47 wt % to 49 wt % tellurium Te, from 18 wt % to 20 wt % bismuth Bi, from 3 wt % to 4 wt % tungsten W, from 0.9 wt % to 1.1 wt % copper Cu, and from 0.1 wt % to 1.1 wt % lanthanum La and/or yttrium Y, where wt % is based on the total wt % metal in the glass frit.

Glass frit can comprise from 26 wt % to 31 wt % lead Pb, from 46 wt % to 51 wt % tellurium Te, from 17 wt % to 21 wt % bismuth Bi, from 2.5 wt % to 4.5 wt % tungsten W, from 0.8 wt % to 1.2 wt % copper Cu, and from 0.1 wt % to 1.1 wt % lanthanum La and/or yttrium Y, where wt % is based on the total wt % metal in the glass frit.

Glass frit can comprise from 25 wt % to 32 wt % lead Pb, from 45 wt % to 52 wt % tellurium Te, from 16 wt % to 22 wt % bismuth Bi, from 2 wt % to 5 wt % tungsten W, from 0.7 wt % to 1.3 wt % copper Cu, and from 0.1 wt % to 1.1 wt % lanthanum La and/or yttrium Y, where wt % is based on the total wt % metal in the glass frit.

For a nominal glass frit composition containing lead oxide PbO, tellurium oxide $TeO_2$, bismuth oxide $Bi_2O_3$, tungsten oxide $WO_3$, and copper oxide CuO, the pull strength of a solar cell electrode can be improved by replacing some of the tellurium oxide $TeO_2$ with lanthanum oxide $La_2O_3$ and/or yttrium oxide $Y_2O_3$. In certain embodiments, from 0.05 wt % to 1 wt %, such as from 0.05 wt % to 0.8 wt %, of the nominal amount of tellurium oxide $TeO_2$ can be replaced with lanthanum oxide $La_2O_3$ and/or yttrium oxide $Y_2O_3$ to improve the electrical properties and pull strength of a solar cell electrode. It has been determined that replacing the bismuth oxide $Bi_2O_3$ and/or lead oxide PbO with lanthanum oxide $La_2O_3$ and/or yttrium oxide $Y_2O_3$ results in electrodes formed from the metallization paste having an increased series resistance and a decreased fill factor.

Glass frit can be characterized, for example, by a molar ratio of bismuth Bi to tellurium Te from 0.01 to 0.5, from 0.05 to 0.4, from 0.1 to 0.3, or from 0.2 to 0.3. A glass frit can be characterized, for example, by an average particle diameter D50 within a range from 0.1 µm to about 20 µm, and may be present in the metallization paste in an amount of about 0.5 wt % to about 20 wt %, where wt % is based on the total weight of the metallization paste. The average particle diameter can be determined using a particle size analyzer. The glass frit may have a spherical or amorphous shape. A metallization paste composition can contain from 0.5 wt % to 5 wt % glass frit, from 1 wt % to 4 wt %, from 1.5 wt % to 4 wt %, from 2 wt % to 4 wt %, or from 2.5 wt % to 3.5 wt % glass frit, where wt % is based on the total weight of the composition.

A glass frit can be characterized by a glass transition temperature ($T_g$) from 200° C. to 800° C., such as, for example, from 200° C. to 600° C., or from 300° C. to 600° C.

A glass frit can comprise a combination of one or more types of glass frit having different average particle diameters and/or glass transition temperatures. For example, a glass frit can comprise a combination of a first glass frit characterized by a glass transition temperature within a range from 200° C. to 320° C. and a second glass frit characterized by a glass transition temperature within a range from 300° C. to 550° C., where the weight ratio of the first glass frit to the second glass frit can range from about 1:0.2 to about 1:1.

Increasing the amount of certain rare earth oxides such as lanthanum oxide and yttrium oxide in glass frit is not known to lead to improved electrical conductivity of conductive electrode pastes. Rather, increasing the content of lanthanum oxide and/or yttrium oxide in metallization frit is expected to reduce the series resistance of solar cells comprising electrodes made with the frit. Increasing the amount of these oxides to increase to the pull strength and reliability without decreasing the electrical properties was unexpected. Conductive pastes formed using other rare earth oxides such as cerium oxide and scandium oxide did not demonstrate improved pull strength. It is possible that lanthanum oxide and yttrium oxide can be distinguished because of the excellent thermal stability compared to other rare earth oxides. Increasing the amount of lanthanum oxide and/or yttrium oxide in the glass frit to improve the pull strength of a metallization paste without decreasing the electrical properties also depends on the content of the other metal oxides forming the frit. In particular, the content of bismuth oxide is important to realizing the properties of the lanthanum oxide and/or yttrium oxide in lead/tellurium-based frit.

A metallization paste may also include an organic vehicle, where the organic vehicle can include, for example, an organic binder, an organic solvent, an additive, or a combination of any of the foregoing.

A metallization paste provided by the present disclosure can comprise, for example, from 0.01 wt % to 5 wt % of an organic resin; from 1 wt % to 45 wt % of a solvent; and from 0.01 wt % to 5 wt % of one or more additives, where wt % is based on the total weight of the composition.

A composition can comprise an organic binder or combination of organic binders.

An organic binder, also referred to as an organic resin, can be used to impart a desired viscosity and/or rheological property to a metallization paste to facilitate screen printing solar cell electrodes. The organic resin can also facilitate homogeneous dispersion of the inorganic component within the printable composition.

Suitable organic binders include, for example, acrylate resins and cellulose resins such as ethylcellulose, ethyl hydroxyethylcellulose, nitrocellulose, blends of ethylcellulose and phenol resins, alkyd resins, phenol resins, acrylate esters, xylenes, polybutanes, polyesters, ureas, melamines, vinyl acetate resins, wood rosin, polymethacrylates of alcohols, and combinations of any of the foregoing.

Other suitable resins include, for example, ethyl cellulose, cellulose ester (CAB, CAP), polyacrylate, polysiloxane (modified), polyvinyl butyral (PVB), polyvinyl pyrrolidone (PVP), saturated polyester, non-reactive polyamide (PA), modified polyether, and combinations of any of the foregoing. Other resins characterized by medium polarity may also be used. In certain embodiments, a resin comprises ethyl cellulose.

The organic binder may be present in an amount from 0.1 wt % to 10 wt %, from 0.1 wt % to 6 wt %, from 0.2 wt % to 4 wt %, from 0.2 wt % to 2 wt %, or from 0.2 wt % to 1 wt %, where wt % is based on the total weight of the printable composition.

A composition can comprise an organic solvent or combination of organic solvents.

An organic solvent can be used to impart solubility, dispersion, and coupling to the metallization paste.

Examples of suitable solvents include terpineol, glycol ether, glycol ether acetate, Texanol™ (ester alcohol), tributyl citrate, tributyl O-acetylcitrate, DBE® esters (mixture of dimethyl adipate, dimethyl glutarate and dimethyl succinate); dimethyl phthalate (DMP), and combinations of any of the foregoing. A suitable solvent can have, for example, a boiling point greater than 200° C. and an evaporation rate less than 0.01 at room temperature. A suitable solvent can be an oxygenated solvent including alcohols such as ethanol, methanol, butanol, n-propyl alcohol, isobutyl alcohol, and isopropyl alcohols; esters such as ethyl acetate, n-butyl acetate, n-propyl acetate, and isopropyl acetate; and ketones such as acetone, diacetone alcohol, isophorone, cyclohexanone, methyl ethyl ketone, and methyl isobutyl ketone. Other suitable ethers, alcohols, and/or esters may also be used.

In certain embodiments, a solvent comprises a glycol ether.

Other examples of suitable solvents include hexane, toluene, ethyl Cellusolve™ cyclohexanone, butyl Cellusolve™, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzyl alcohol, γ-butyrolactone, ethyl lactate, and combinations of any of the foregoing.

A printable composition can include from 1 wt % to 15 wt %, from 2 wt % to 10 wt %, from 3 wt % to 9 wt %, or from 5 wt % to 8 wt % of an organic solvent, where wt % is based on the total weight of the printable composition.

A metallization paste may further include additives to modify the physical properties of the paste such as to enhance flow, process properties, and stability. Additives may include, for example, dispersants, thixotropic agents, plasticizers, viscosity stabilizers, anti-foaming agents, surfactants, pigments, UV stabilizers, antioxidants, coupling agents, and combinations of any of the foregoing.

An additive or combination of additives may be present in the composition in an amount, for example, from 0.1 wt % to about 5 wt %, from 0.1 wt % to 1.5 wt %, from 0.5 wt % to 1.5 wt % or from, 0.3 wt % to 1 wt %, where wt % is based on the total weight of the composition.

A printable metallization paste can include, for example, from 80 wt % to 95 wt % Ag particles, from 1 wt % to 5 wt % of glass frit provided by the present disclosure, from 0.025 wt % to 0.175 wt % fumed silica, from 0.2 wt % to 0.6 wt % organic binder, from 5 wt % to 9 wt % solvent, from 0.3 wt % to 0.7 wt % thixotropic additives, and from 0.05 wt % to 0.35 wt % dispersant, where wt % is based on the total weight of the printable metallization paste.

A printable metallization paste can include, for example, from 85 wt % to 92 wt % Ag particles, from 1.5 wt % to 4 wt % of glass frit provided by the present disclosure, from 0.05 wt % to 0.15 wt % fumed silica, from 0.3 wt % to 0.5 wt % organic binder, from 6 wt % to 8 wt % solvent, from 0.4 wt % to 0.6 wt % thixotropic additives, and from 0.1 wt % to 0.3 wt % dispersant, where wt % is based on the total weight of the printable metallization paste.

A metallization paste can comprise from 1 wt % to 5 wt % glass frit; from 0.01 wt % to 1 wt % surfactant; and from 0.01 wt % to 2 wt % defoaming agent, wherein wt % is based on the total weight of the printable composition.

For screen printing fine lines with a high aspect ratio it is desirable that a frontside metallization paste provided by the present disclosure exhibit a viscosity of 500 Poise to 7000 Poise at a temperature from 15° C. to 50° C., as determined using a viscometer with a 10 rpm spindle rotation rate.

It can also be desirable that the frontside metallization paste exhibit a glass transition temperature $T_g$ from 200° C. to 800° C. as determined using differential scanning calorimetry (DSC).

The front-side metallization paste can be prepared using the following procedure.

The glass frit can be prepared by combining the metal oxides, melting the combined metal oxides to form a glass, quenching the glass, and milling the glass to provide glass frit with a desired mean particle diameter and dispersity.

The organic vehicle can be prepared by mixing and heating a solvent or mixture of solvents and organic resin or organic resins, plasticizer, defoaming agent, and additives such as rheological thixotropic additive.

The silver Ag particles can be combined with the organic vehicle, glass frit, organic vehicle and other additives and thoroughly mixed.

The metallization paste can then be milled to achieve a desired dispersion of the inorganic components. The metallization paste can then be filtered to remove any undesired large particulates.

The metallization paste can be applied to a front surface of a silicon solar cell by screen printing. The screen used in solar cell screen printing can be a mesh covered by an emulsion which is patterned to form the grid pattern. The mesh number can be, for example, from 300 mesh to 400 mesh, such as from 325 mesh to 380 mesh and the mesh wire, which can be stainless steel, can have a diameter from about 0.3 mils to 1.5 mils, such as a diameter from 0.7 mils to 1.1 mils. Other screens and mesh sizes can be used as appropriate for a particular metallization paste, process conditions, and desired feature sizes.

The deposited metallization paste in the form of electrical conductors such as grid lines can have, for example, a width from 0.5 mils to 4 mils, and a height from 0.1 mils to 1.5 mils.

After being applied to a Si substrate, the screen-printed composition can be dried, for example, at a temperature from 200° C. to 400° C. for from 10 seconds to 60 seconds, and then baked and fired at a temperature from 400° C. to 950° C., such as from 850° C. to 950° C., from 30 seconds to 50 seconds, to provide frontside electrical conductors.

Electrical conductors having dimensions of 1.2 mm width and 16 μm height can exhibit and electrical resistivity of 1.8 Ω-cm and can exhibit an adhesion strength of at least 2 N on a Si substrate, where the electrical conductivity is determined according to line resistivity electrical probe measurement and the adhesion strength is determined according to a 180° solder tab pull test. For context, Ag thick-film busbars having a resistivity less than 2 Ω-cm and an adhesion strength greater than 1.5 N are generally considered acceptable for use in the solar cell industry.

Solar cell conductive electrodes prepared from compositions provided by the present disclosure maintain acceptable conductivity and adhesion strength following exposure to accelerated environmental test conditions including damp-heat testing and accelerated thermal cycling, which are used to qualify solar cells for a 25-year service life.

FIG. 1 shows a cross-section view of a solar cell after a metallization paste is screen printed onto the top surface of the solar cell and before thermal processing. The solar cell in FIG. 1 includes p-type silicon substrate 10, n-type diffusion layer 20, antireflective coating (ARC) 30, backside aluminum metallization paste 60, backside silver- or silver/aluminum-containing metallization paste 70, and frontside silver-containing thick film paste 500.

Figure 2:
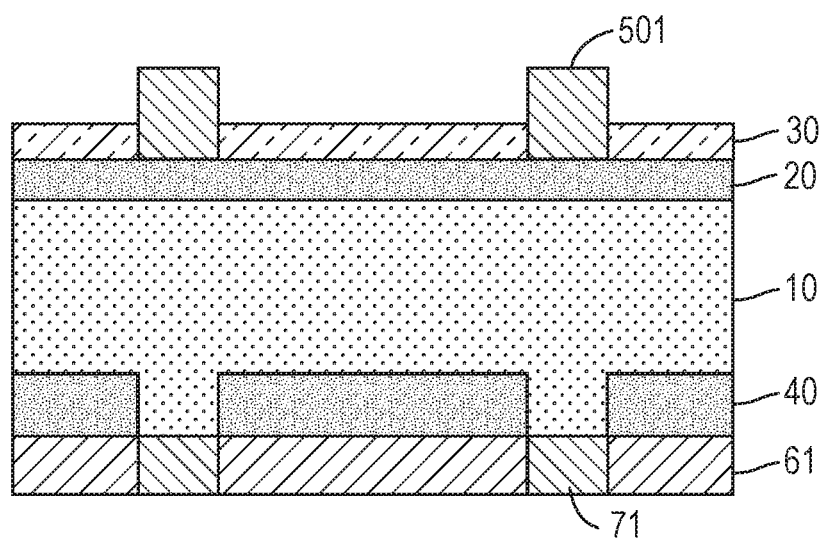
FIG. 2 shows the structure of a conventional silicon solar cell after thermal processing.

FIG. 2 shows a cross-section view of a solar cell after thermal processing. The solar cell in FIG. 2 includes p-type silicon substrate 10, n-type diffusion layer 20, antireflective coating 30, p+ back surface field (BSF) 40, backside aluminum electrode 61, backside silver or silver/aluminum busbar electrode 71 formed by co-firing backside silver- or silver/aluminum-containing paste (70 in FIG. 1), and frontside silver electrode 501 and ohmic contact formation formed by firing the front side silver-containing thick-film paste (500 in FIG. 1) through the ARC (layer 30).

Frontside metallization pastes provided by the present disclosure can be applied to silicon solar cells and fired to provide electrical conductors such as gridlines and busbars. Thus, according to the present invention, silicon solar cells comprise electrical conductors formed from the metallization pastes provided by the present disclosure. A silicon solar cell can comprise electrical conductors formed from a metallization paste comprising a glass frit provided by the present disclosure.

A silicon solar cell can comprise electrical conductors where the electrical conductors include, for example, from 0.8 wt % to 1 wt % lead Pb; from 1.4 wt % to 1.6 wt % of tellurium Te; from 0.6 wt % to 0.7 wt % bismuth Bi; from 0.09 wt % to 0.11 wt % of tungsten W; from 0.03 wt % to 0.04 wt % copper Cu; and from 0.0001 wt % to 0.04 wt % of a rare earth metal comprising lanthanum La, yttrium Y, or a combination thereof, where wt % is based on the weight of the electrode. The weight of the electrode refer to the weight of the electrode being evaluated, which can be a portion of the electrode on a solar cell.

A silicon solar cell can comprise electrical conductors where the electrical conductors include, for example, from 0.7 wt % to 1.1 wt % lead Pb; from 1.3 wt % to 1.7 wt % of tellurium Te; from 0.5 wt % to 0.8 wt % bismuth Bi; from 0.08 wt % to 0.12 wt % of tungsten W; from 0.025 wt % to 0.045 wt % copper Cu; and from 0.0001 wt % to 0.04 wt % of a rare earth metal comprising lanthanum La, yttrium Y, or a combination thereof, where wt % is based on the weight of the electrode.

A silicon solar cell can comprise electrical conductors where the electrical conductors include, for example, from 0.6 wt % to 1.2 wt % lead Pb; from 1.2 wt % to 1.8 wt % of tellurium Te; from 0.4 wt % to 0.9 wt % bismuth Bi; from 0.07 wt % to 0.13 wt % of tungsten W; from 0.02 wt % to 0.05 wt % copper Cu; and from 0.0001 wt % to 0.04 wt % of a rare earth metal comprising lanthanum La, yttrium Y, or a combination thereof, where wt % is based on the weight of the electrode.

An electrode can comprise, for example, from 0.9 wt % to 0.92 wt % lead Pb, from 0.89 wt % to 0.93 wt %, from 0.88 wt % to 0.94 wt %, or from 0.87 wt % to 0.95 wt % lead Pb, where wt % is based on the weight of the electrode.

An electrode can comprise, for example, from 1.50 wt % to 1.52 wt % tellurium Te, from 1.49 wt % to 1.53 wt %, from 1.48 wt % to 1.54 wt %, or from 1.47 wt % to 1.55 wt % tellurium Te, where wt % is based on the weight of the electrode.

An electrode can comprise, for example, from 0.61 wt % to 0.63 wt % bismuth Bi, from 0.60 wt % to 0.64 wt %, from 0.59 wt % to 0.65 wt %, or from 0.58 wt % to 0.66 wt % bismuth Bi, where wt % is based on the weight of the electrode.

An electrode can comprise, for example, from 0.09 wt % to 0.11 wt % lead tungsten W, from 0.08 wt % to 0.12 wt %, from 0.07 wt % to 0.13 wt %, or from 0.06 wt % to 0.14 wt % tungsten W, where wt % is based on the weight of the electrode.

An electrode can comprise, for example, from 0.034 wt % to 0.036 wt % copper Cu, from 0.033 wt % to 0.037 wt %, from 0.032 wt % to 0.038 wt %, or from 0.031 wt % to 0.039 wt % copper Cu, where wt % is based on the weight of the electrode.

An electrode can comprise, for example, from 0.002 wt % to 0.02 wt % lanthanum and/or yttrium, from 0.0025 wt % to 0.025 wt %, from 0.003 wt % to 0.03 wt %, or from 0.002 wt % to 0.04 wt % lanthanum and/or yttrium, where wt % is based on the weight of the electrode.

A solar cell comprises an electrode, wherein the electrode comprises from 0.6 wt % to 1.8 wt % of lead oxide PbO; from 0.6 wt % to 1.8 wt % of tellurium oxide TeO, from 0.03 wt % to 0.9 wt % of bismuth oxide $Bi_2O_3$; from 0.003 wt % to 0.15 wt % of tungsten oxide $WO_3$; from 0.003 wt % to 0.15 wt % of copper oxide $Cu_2O$; and from 0.0003 wt % to 0.03 wt % of a rare earth oxide comprising lanthanum oxide $La_2O_3$, yttrium oxide $Y_2O_3$, or a combination thereof, wherein wt % is based on the total weight of the glass frit.

A solar cell comprises an electrode, wherein the electrode comprises from 0.8 wt % to 1.6 wt % of lead oxide PbO; from 0.8 wt % to 1.6 wt % of tellurium oxide TeO; from 0.1 wt % to 0.7 wt % of bismuth oxide $Bi_2O_3$; from 0.02 wt % to 0.12 wt % of tungsten oxide $WO_3$; from 0.05 wt % to 0.15 wt % of copper oxide $Cu_2O$; and from 0.005 wt % to 0.025 wt % of a rare earth oxide comprising lanthanum oxide $La_2O_3$, yttrium oxide $Y_2O_3$, or a combination thereof, wherein wt % is based on the total weight of the glass frit.

A solar cell comprises an electrode, wherein the electrode comprises from 1.0 wt % to 1.4 wt % of lead oxide PbO; from 1.0 wt % to 1.4 wt % of tellurium oxide TeO; from 0.1 wt % to 0.5 wt % of bismuth oxide $Bi_2O_3$; from 0.05 wt % to 0.10 wt % of tungsten oxide $WO_3$; from 0.05 wt % to 0.10 wt % of copper oxide $Cu_2O$; and from 0.01 wt % to 0.02 wt % of a rare earth oxide comprising lanthanum oxide $La_2O_3$, yttrium oxide $Y_2O_3$, or a combination thereof, wherein wt % is based on the total weight of the glass frit.

Silicon solar cells having electrodes made from the metallization pastes provided by the present disclosure can be incorporated into photovoltaic modules and photovoltaic systems.

EXAMPLES

Embodiments provided by the present disclosure are further illustrated by reference to the following examples, which describe the fabrication and performance of solar cells according to the present invention. It will be apparent to those skilled in the art that many modifications, both to materials, and methods, may be practiced without departing from the scope of the disclosure.

Example 1

Glass Frit Prepared from Rare Earth Metal Oxides

Glass frit were formed having the compositions presented in Table 1.

TABLE 1

| Glass frit. | | | | | |
|---|---|---|---|---|---|
| Lead Oxide[1] PbO (wt %) | Tellurium Oxide[2] $TeO_2$ (wt %) | Bismuth Oxide[3] $Bi_2O_3$ (wt %) | Tungsten Oxide[4] $WO_3$ (wt %) | Copper Oxide[5] $Cu_2O$ (wt %) | Rare Earth Oxide[6,7] $La_2O_3/Y_2O_3$ (wt %) |
| 28 | 49 | 18.5 | 3 | 1.5 | 0 |
| 28 | 48.8 | 18.5 | 3 | 1.5 | 0.2 |
| 28 | 48.6 | 18.5 | 3 | 1.5 | 0.4 |
| 28 | 48.4 | 18.5 | 3 | 1.5 | 0.6 |
| 28 | 48.2 | 18.5 | 3 | 1.5 | 0.8 |

[1]Lead(II) oxide from Alfa Aesar, product number 12220.
[2]Tellurium(IV) oxide from Alfa Aesar, product number 87813.
[3]Bismuth(III) oxide from Alfa Aesar, product number 44657.
[4]Tungsten(VI) oxide from Alfa Aesar, product number 43344.
[5]Copper(I) oxide from Alfa Aesar, product number 40188.
[6]Lanthanum(III) oxide from Alfa Aesar, product number 41644.
[7]Yttrium oxide(III) from Alfa Aesar, product number 44286.

The metal oxides were combined and heated to a temperature from 800° C. to 1300° C. to fuse the oxides. The glass was cooled to room temperature. The glass was then milled to provide a fine glass frit particle distribution. The glass frit was characterized by an average particle size D50 of 2 μm.

Example 2

Metallization Paste Containing Glass Frit with $La_2O_3$ or $Y_2O_3$

Metallization pastes containing glass frit with various amounts of the metal oxides $La_2O_3$ or $Y_2O_3$ were prepared. The nominal content of the metallization paste is shown in Table 2.

TABLE 2

| Metallization paste. | | | |
|---|---|---|---|
| Material | Product No. | Source | Content (wt %) |
| Ag Particles | AG-4-8 | Dowa Hightech | 89 |
| Glass Frit | Example 1 | GF1 | 3 |
| Fumed Silica | Aerosil ® 200 | Evonik Co. | 0.1 |
| Binder | ETHOCEL ™ Ethylcellulose STD4 | Dow Chemical | 0.4 |
| Solvent | Texanol ™ ester alcohol | Eastman Chemical | 6.8 |
| Thixotropic Additive | Thixatrol ® ST | Elementis Co. | 0.5 |
| Dispersant | DISPERBYK ® 102 | BYK-chemie | 0.2 |

An organic binder, 1.0 wt % of ETHOCEL™ ethylcellulose (STD4, Dow Chemical Company), was dissolved in 6.69 wt % of Texanol™ (Texanol™ ester-alcohol, Eastman Chemical Company) at 60° C., and 89 wt % of spherical silver particles (AG-4-8, Dowa Hightech Co., Ltd.) having an average particle diameter of 2.0 μm, 2.5 wt % of the glass frit of Example 1 having an average particle diameter of 1.0 μm and a transition temperature $T_g$ of 350° C., 0.01 wt % of fumed silica (Aerosil® 200, Evonik Co., Ltd.) having a BET specific surface area of 200±25 m$^2$/g, 0.4 wt % of a dispersant (DISPERBYK® 102, BYK-chemie), and 0.4 wt % of a thixotropic agent (Thixatrol® ST, Elementis Co., Ltd.) were added to the binder solution, followed by mixing and kneading in a 3-roll mill, to prepare a screen printable metallization paste.

The composition was deposited by screen printing in a predetermined pattern over a front surface of a silicon wafer having an anti-reflective coating with an underlying doped Si emitter with sheet resistance of about 85 Ω/sq, followed by drying in an infrared (IR) drying furnace. Then, an aluminum paste was printed on a rear side of the silicon wafer and dried in the same manner. Cells formed according to this procedure were subjected to baking at 400° C. to 900° C. for 30 sec to 50 sec in a belt-type baking furnace. The fill factor (FF) and conversion efficiency (%) of the cells were determined using a solar cell efficiency tester PSS 10 II (Berger Lichttechnik GmbH & Co.). The measured fill factor and conversion efficiency are shown in Table 3 and in Table 4.

The metallization paste was screen printed onto polysilicon wafers to provide lines that were 40 μm wide and 20 μm high. The paste was then fired at a temperature from 400° C. for about 30 seconds to provide sintering and ohmic contact for the solar cell electrode metallization.

Pull strength was measured using a pull tester where a copper solder-coated ribbon was soldered to the solar cell busbar and the ribbon was pulled at 180°. FF was determined according to current-voltage curve determined as the ratio of the maximum-power-point to the product of the open-circuit voltage and short-circuit current. Efficiency was determined from the current-voltage curve as the percent ratio of the maximum-power-point to the input power of the impinging light on the solar cell from a solar simulator.

Figure 3:
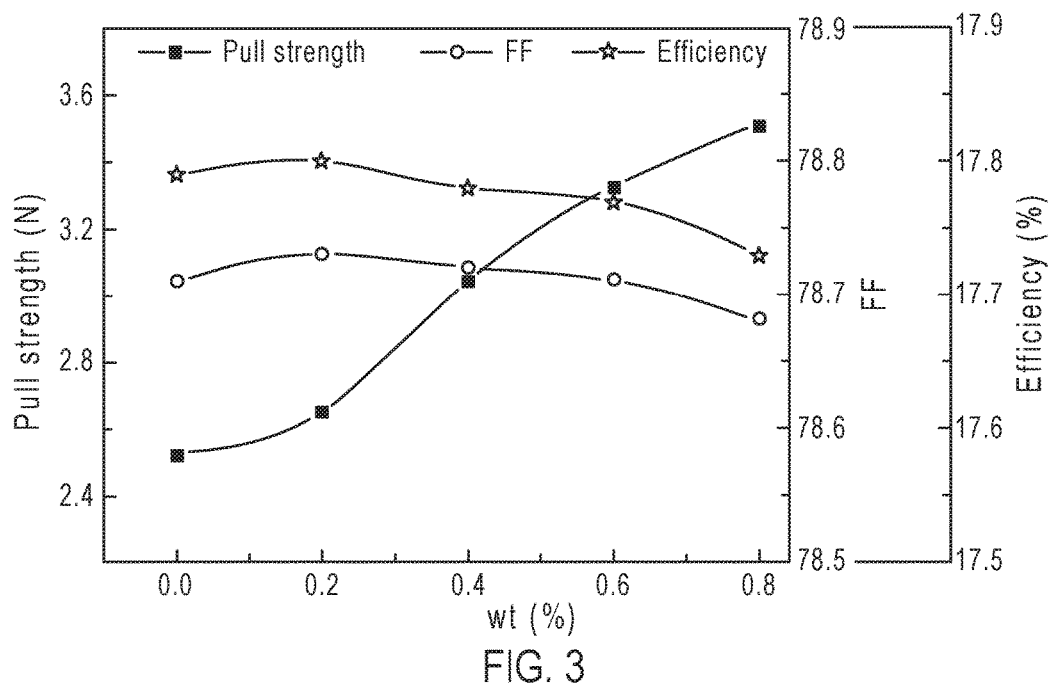
FIG. 3 is a graph showing the effect of the amount of $La_2O_3$ used to from the glass frit used in the topside metallization on the pull strength of the metallization lines and on the electrical performance of a silicon solar cell.
Figure 4:
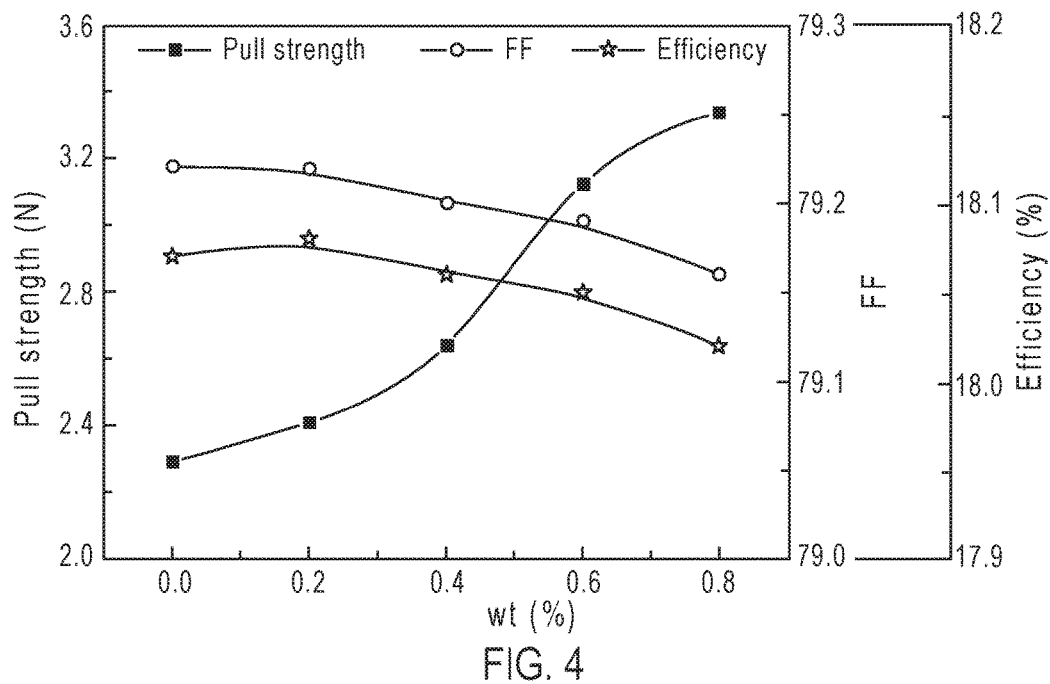
FIG. 4 is a graph showing the effect of the amount of $Y_2O_3$ used to form the glass frit used in the topside metallization on the pull strength of the metallization lines and on the electrical performance of a silicon solar cell.

The test results are provided in Table 3, Table 4, FIG. 3 and FIG. 4.

TABLE 3

The effect of $La_2O_3$ on pull strength and electrical performance.

| Property | Value | | | | |
|---|---|---|---|---|---|
| wt % $La_2O_3$ in glass frit* | 0 | 0.2 | 0.4 | 0.6 | 0.8 |
| wt % $La_2O_3$ in electrode† | 0 | 0.006 | 0.013 | 0.020 | 0.026 |
| Pull strength (N) | 2.5 | 2.6 | 3.0 | 3.3 | 3.5 |
| FF | 78.7 | 78.7 | 78.7 | 78.7 | 78.7 |
| Efficiency (%) | 17.8 | 17.8 | 17.8 | 17.8 | 17.7 |

*Wt % rare earth oxide used to prepare the glass frit, where wt % is based on the total weight of metal oxides used to form the glass frit.
†Wt % rare earth oxide in electrode, where wt % is based on the weight of the electrode.

TABLE 4

The effect of $Y_2O_3$ on pull strength and electrical performance.

| Property | Value | | | | |
|---|---|---|---|---|---|
| wt % $Y_2O_3$ in glass frit* | 0 | 0.2 | 0.4 | 0.6 | 0.8 |
| wt % $Y_2O_3$ in electrode† | 0 | 0.006 | 0.013 | 0.019 | 0.025 |
| Pull strength (N) | 2.3 | 2.4 | 2.6 | 3.1 | 3.3 |
| FF | 79.2 | 79.2 | 79.2 | 79.2 | 79.2 |
| Efficiency (%) | 18.1 | 18.1 | 18.1 | 18.1 | 18.0 |

*Wt % rare earth oxide used to prepare the glass frit, where wt % is based on the total weight metal oxides used to form the glass frit.
†Wt % rare earth oxide in electrode, where wt % is based on the weight of the electrode.

FIG. 3 is a graph showing the effect of the amount of $La_2O_3$ used to form the glass frit used in the topside metallization on the pull strength of the metallization lines and on the electrical performance of a multicrystalline silicon solar cell. As shown in FIG. 3, the pull strength increases with increasing $La_2O_3$ up to about 0.8 wt % at which wt % the pull strength is about 3.5 N. Over this wt % $La_2O_3$ wt % range, the FF is about 78.7 and the efficiency is within a range from about 17.7% to about 17.8%.

FIG. 4 is a graph showing the effect of the amount of $Y_2O_3$ used to form the glass frit used in the topside metallization on the pull strength of the metallization lines and on the electrical performance of a silicon solar cell. As shown in FIG. 4, the pull strength increases with increasing wt % $Y_2O_3$ up to about 0.8 wt % at which wt % the pull strength is about 3.4 N. Over this $Y_2O_3$ wt % range, the FF is within the range of about 79.1 to about 79.2, and the efficiency is within a range from about 18.0% to about 18.1%.

Increasing the content of lanthanum oxide $La_2O_3$ and/or yttrium oxide $Y_2O_3$ above about 0.8 wt % leads to increased pull strength; however, at higher wt % of the rare earth oxides the series resistance and in particular the contact resistance increases.

In the examples, the nominal tellurium oxide $TeO_2$ content was replaced with either lanthanum oxide $La_2O_3$ or yttrium oxide $Y_2O_3$, which resulted in a composition having increased pull strength and acceptable electrical properties. If, however, the nominal lead oxide PbO or bismuth oxide $Bi_2O_3$ was replaced with either lanthanum oxide $La_2O_3$ or yttrium oxide $Y_2O_3$, the series resistance increased and the FF and conversion efficiency decreased.

The environmental reliability of conductors prepared using compositions comprising $La_2O_3$ was evaluated. Metallization pastes containing different amounts of $La_2O_3$ were prepared. The metallization pastes were applied to a 4-busbar large area 156 mm×156 mm silicon solar cell. The pastes were then fired at a temperature from 400° C. for about 30 seconds to provide sintering and ohmic contact for the solar cell electrode metallization. The solar cells were then subjected to a temperature of 150° C. for 0 hrs, 5 hrs, or 20 hrs. The pull strength was measured using a pull tester where a copper solder-coated ribbon was soldered to the solar cell busbar and the ribbon was pulled at 180°. The results are presented in FIG. 5.

Figure 5:
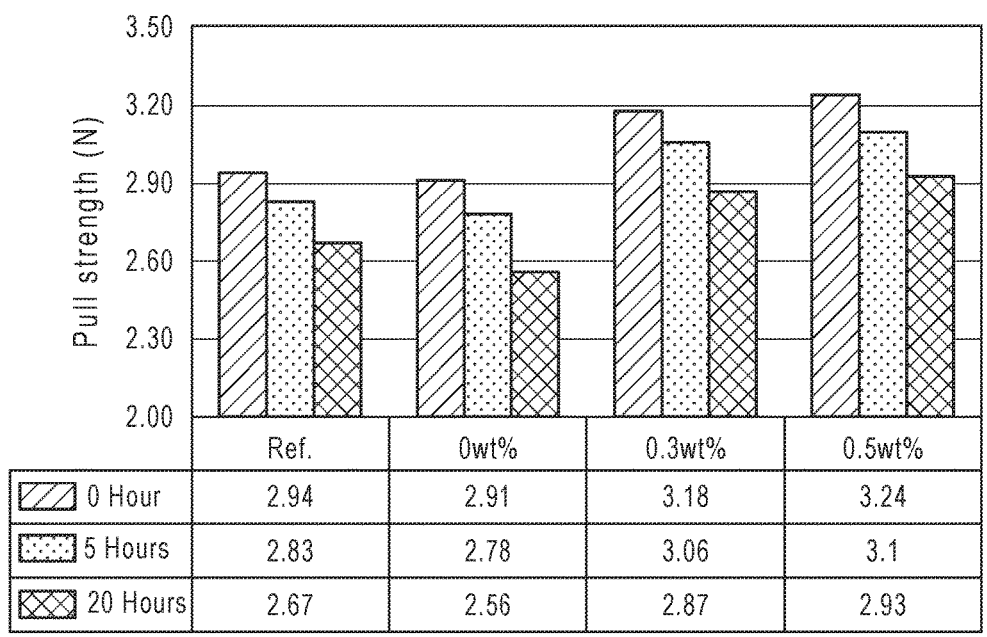
FIG. 5 includes a graph and a chart showing the effect of $La_2O_3$ wt % in the glass frit used to form the front-side metallization paste on the adhesion with time under 150° C. environmental testing

FIG. 5 includes a table and a chart showing the effect of wt % $La_2O_3$ used to form the glass frit on the pull strength of the electrical conductors before and following exposure to accelerated aging conditions for 5 hours and for 20 hours. "Ref" refers to the results of a reference paste standard used for quality control. A viable paste must meet or exceed the properties of the reference standard paste. Electrical conductors formed using the metallization pastes provided by the present disclosure also exhibit acceptable properties following exposure to 150 C in air for up to 100 h. The electrical conductors also pass module level testing standards such as TUV (Germany) and UL (US), which include thermal cycling typically of at least 200 cycles, −40° C. to 85° C. temperature cycling; damp heat testing, 85° C. at 85% humidity for 1,000 hours, humidity freeze test, hail impact, mechanical load test, thermal test, irradiance test, and others.

Aspects of the present include:

Aspect 1. A composition comprising silver particles fumed silica; and glass frit, wherein the glass frit comprises a rare earth metal comprising lanthanum La, yttrium Y, or a combination thereof.

Aspect 2. The composition of Aspect 1, wherein the glass frit comprises from 0.01 wt % to 1 wt % lanthanum La, yttrium Y, or a combination thereof, where wt % is based on the total weight of the glass frit.

Aspect 3. The composition of Aspects 1-2, wherein the glass frit is prepared from a metal oxide composition comprising from 20 wt % to 60 wt % lead oxide PbO; from 20 wt % to 60 wt % tellurium oxide TeO; from 1 wt % to 30 wt % bismuth oxide $Bi_2O_3$; from 0.1 wt % to 5 wt % tungsten oxide $WO_3$; from 0.1 wt % to 5 wt % copper oxide $Cu_2O$; and from 0.01 wt % to 1 wt % of a rare earth metal oxide selected from lanthanum oxide $La_2O_3$, yttrium oxide $Y_2O_3$, or a combination thereof, wherein wt % is based on the total weight of the metal oxide composition.

Aspect 4. The composition of Aspects 1-3, wherein the glass frit comprises from 21 wt % to 64 wt % lead Pb; from 19 wt % to 55 wt % tellurium Te; from 1.05 wt % to 31 wt % bismuth Bi; from 0.09 wt % to 4.5 wt % tungsten W; from 0.12 wt % to 5.1 wt % copper Cu; and from 0.01 wt % to 1 wt % of the rare earth metal comprising lanthanum La, yttrium Y, or a combination thereof, wherein wt % is based on the total weight of the glass frit.

Aspect 5. The composition of Aspects 1-4, wherein the glass frit is characterized by an average particle diameter D50 from 0.1 μm to 20 μm.

Aspect 6. The composition of Aspects 1-5, further comprising an organic resin; a solvent; and one or more additives.

Aspect 7. The composition of Aspects 1-6, wherein the composition comprises from 80 wt % to 95 wt % of the silver particles; from 0.1 wt % to 1 wt % of the fumed silica; and from 1 wt % to 5 wt % of the glass frit, wherein wt % is based on the total weight of the composition.

Aspect 8. The composition of Aspects 1-7, further comprising from 0.1 wt % to 10 wt % of an organic resin; from 1 wt % to 20 wt % of a solvent; and from 0.01 wt % to 5 wt % of one or more additives, wherein wt % is based on the total weight of the composition.

Aspect 9. A solar cell comprising an electrode prepared from the composition of Aspects 1-8.

Aspect 10. A glass frit prepared from a composition comprising from 20 wt % to 60 wt % lead oxide PbO; from 20 wt % to 60 wt % tellurium oxide TeO; from 1 wt % to 30 wt % bismuth oxide $Bi_2O_3$; from 0.1 wt % to 5 wt % tungsten oxide $WO_3$; from 0.1 wt % to 5 wt % copper oxide $Cu_2O$; and from 0.01 wt % to 1 wt % of a rare earth metal oxide comprising lanthanum oxide $La_2O_3$, yttrium oxide $Y_2O_3$, or a combination thereof, wherein wt % is based on the total weight of the composition.

Aspect 11. The glass frit of Aspect 10, wherein the rare earth metal oxide comprises $La_2O_3$.

Aspect 12. The glass frit of Aspects 10-11, wherein the rare earth metal oxide comprises $Y_2O_3$.

Aspect 13. The glass frit of Aspects 10-12, wherein the glass frit is characterized by an average particle diameter D50 from 0.1 μm to 20 μm.

Aspect 14. A solar cell comprising an electrode, wherein the electrode comprises the glass frit of claim 10.

Aspect 15. A glass frit comprising from 21 wt % to 64 wt % lead Pb; from 19 wt % to 55 wt % tellurium Te; from 1.05 wt % to 31 wt % bismuth Bi; from 0.09 wt % to 4.5 wt % tungsten W; from 0.12 wt % to 5.1 wt % copper Cu; and from 0.01 wt % to 1 wt % of a rare earth metal comprising lanthanum La, yttrium Y, or a combination thereof, wherein wt % is based on the total weight of the glass frit.

Aspect 16. A solar cell comprising an electrode, wherein the electrode comprises the glass frit of Aspect 15.

Aspect 17. A solar cell comprising an electrode, wherein the electrode comprises from 0.6 wt % to 1.9 wt % lead Pb; from 0.6 wt % to 1.6 wt % tellurium Te; from 0.03 wt % to 0.9 wt % bismuth Bi; from 0.003 wt % to 0.13 wt % tungsten W; from 0.004 wt % to 0.15 wt % copper Cu; and from 0.0003 wt % to 0.029 wt % of a rare earth metal comprising lanthanum La, yttrium Y, or a combination thereof, wherein wt % is based on the weight of the electrode.

Aspect 18. The solar cell of Aspect 17, wherein the rare earth metal comprises lanthanum La.

Aspect 19. The glass frit of claim solar cell of Aspects 17-18, wherein the rare earth metal comprises yttrium Y.

It should be noted that there are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof.

What is claimed is:

1. A glass frit prepared from a composition comprising:
   from 20 wt % to 60 wt % lead oxide PbO;
   from 20 wt % to 60 wt % tellurium oxide TeO;
   from 1 wt % to 30 wt % bismuth oxide $Bi_2O_3$;
   from 0.1 wt % to 5 wt % tungsten oxide $WO_3$;
   from 0.1 wt % to 5 wt % copper oxide $Cu_2O$; and
   from 0.01 wt % to 1 wt % of a rare earth metal oxide comprising lanthanum oxide $La_2O_3$, yttrium oxide $Y_2O_3$, or a combination thereof,
   wherein wt % is based on the total weight of the composition.

2. The glass frit of claim 1, wherein the rare earth metal oxide comprises $La_2O_3$.

3. The glass frit of claim 1, wherein the rare earth metal oxide comprises $Y_2O_3$.

4. The glass frit of claim 1, wherein the glass frit is characterized by an average particle diameter D50 from 0.1 μm to 20 μm.

5. A solar cell comprising an electrode, wherein the electrode comprises the glass frit of claim 1.

6. A glass frit comprising:
   from 21 wt % to 64 wt % lead Pb;
   from 19 wt % to 55 wt % tellurium Te;
   from 1.05 wt % to 31 wt % bismuth Bi;
   from 0.09 wt % to 4.5 wt % tungsten W;
   from 0.12 wt % to 5.1 wt % copper Cu; and
   from 0.01 wt % to 1 wt % of a rare earth metal comprising lanthanum La, yttrium Y, or a combination thereof,
   wherein wt % is based on the total weight of the glass frit.

7. A solar cell comprising an electrode, wherein the electrode comprises the glass frit of claim 6.

8. A composition comprising:
   silver particles;
   fumed silica; and
   glass frit, wherein the glass frit is prepared from a metal oxide composition comprising:
   from 20 wt % to 60 wt % lead oxide PbO;
   from 20 wt % to 60 wt % tellurium oxide TeO;
   from 1 wt % to 30 wt % bismuth oxide $Bi_2O_3$;
   from 0.1 wt % to 5 wt % tungsten oxide $WO_3$;
   from 0.1 wt % to 5 wt % copper oxide $Cu_2O$; and
   from 0.01 wt % to 1 wt % of a rare earth metal oxide comprising selected from lanthanum oxide $La_2O_3$, yttrium oxide $Y_2O_3$, or a combination thereof,
   wherein wt % is based on the total weight of the metal oxide composition.

9. The composition of claim 8, wherein the glass frit is characterized by an average particle diameter D50 from 0.1 μm to 20 μm.

10. The composition of claim 8, further comprising:
    an organic resin;
    a solvent; and
    one or more additives.

11. The composition of claim 8, wherein the composition comprises:
    from 80 wt % to 95 wt % of the silver particles;
    from 0.1 wt % to 1 wt % of the fumed silica; and
    from 1 wt % to 5 wt % of the glass frit, wherein wt % is based on the total weight of the composition.

12. The composition of claim 11, further comprising:
from 0.1 wt % to 10 wt % of an organic resin;
from 1 wt % to 20 wt % of a solvent; and
from 0.01 wt % to 5 wt % of one or more additives,
wherein wt % is based on the total weight of the composition.

13. A solar cell comprising an electrode prepared from the composition of claim 8.

14. A composition comprising:
silver particles;
fumed silica; and
glass frit, wherein the glass frit comprises:
   from 21 wt % to 64 wt % lead Pb;
   from 19 wt % to 55 wt % tellurium Te;
   from 1.05 wt % to 31 wt % bismuth Bi;
   from 0.09 wt % to 4.5 wt % tungsten W;
   from 0.12 wt % to 5.1 wt % copper Cu; and
   from 0.01 wt % to 1 wt % of the rare earth metal comprising lanthanum La, yttrium Y, or a combination thereof,
   wherein wt % is based on the total weight of the glass frit.

15. The composition of claim 14, wherein the glass frit is characterized by an average particle diameter D50 from 0.1 μm to 20 μm.

16. The composition of claim 14, further comprising:
an organic resin;
a solvent; and
one or more additives.

17. The composition of claim 14, wherein the composition comprises:
from 80 wt % to 95 wt % of the silver particles;
from 0.1 wt % to 1 wt % of the fumed silica; and
from 1 wt % to 5 wt % of the glass frit,
wherein wt % is based on the total weight of the composition.

18. The composition of claim 17, further comprising:
from 0.1 wt % to 10 wt % of an organic resin;
from 1 wt % to 20 wt % of a solvent; and
from 0.01 wt % to 5 wt % of one or more additives,
wherein wt % is based on the total weight of the composition.

19. A solar cell comprising an electrode prepared from the composition of claim 14.

20. A solar cell comprising an electrode, wherein the electrode comprises:
from 0.6 wt % to 1.9 wt % lead Pb;
from 0.6 wt % to 1.6 wt % tellurium Te;
from 0.03 wt % to 0.9 wt % bismuth Bi;
from 0.003 wt % to 0.13 wt % tungsten W;
from 0.004 wt % to 0.15 wt % copper Cu; and
from 0.0003 wt % to 0.029 wt % of a rare earth metal comprising lanthanum La, yttrium Y, or a combination thereof,
wherein wt % is based on the weight of the electrode.

21. The solar cell of claim 20, wherein the rare earth metal comprises lanthanum La.

22. The glass frit of claim solar cell of claim 20, wherein the rare earth metal comprises yttrium Y.

* * * * *